United States Patent [19]

Bufano, Jr. et al.

[11] Patent Number: 4,751,405
[45] Date of Patent: Jun. 14, 1988

[54] EXTERNALLY PROGRAMMABLE, PROCESS AND TEMPERATURE INSENSITIVE THRESHOLD RECEIVER CIRCUIT

[75] Inventors: Louis A. Bufano, Jr., Tewksbury, Mass.; Robert B. Smith, West Jordan, Utah

[73] Assignee: Gould Inc., Rolling Meadows, Ill.

[21] Appl. No.: 769,284

[22] Filed: Aug. 26, 1985

[51] Int. Cl.$^4$ .................. H03K 5/153; H03K 5/24
[52] U.S. Cl. ................................ 307/350; 307/355; 307/362; 307/491
[58] Field of Search ............. 307/296 R, 297, 356, 307/290, 360, 362, 355, 356, 491

[56] References Cited

U.S. PATENT DOCUMENTS

| | | | |
|---|---|---|---|
| 3,546,481 | 12/1970 | Talley | 307/360 |
| 4,168,528 | 9/1979 | Comer | 307/296 R |
| 4,430,582 | 2/1984 | Bose et al. | 307/297 |
| 4,584,492 | 4/1986 | Sharp | 307/297 |

Primary Examiner—John Zazworsky
Attorney, Agent, or Firm—G. P. Edgell; R. J. Fox; E. E. Sachs

[57] ABSTRACT

A threshold receiver circuit consists of a reference subcircuit and one or more signal input subcircuits. The reference subcircuit derives a mirror voltage by regulating a reference current flowing through an external reference resistor. The mirror voltage is distributed to each of the signal input subcircuits. Within each signal input subcircuit a signal transistor has its gate connected to the mirror voltage and its drain connected to a common input node, thereby causing a signal current to flow into the common input node which is proportional to the reference current. The signal current also flows through an external signal input resistor which is connected to the input node, and into the external input signal source. The input node voltage is thus equal to the input signal source voltage plus the voltage-drop across the signal input resistor. This input node voltage is compared to an internal reference voltage by a comparator which is also connected to the common input node. Thus, a logic output signal is produced by the comparator corresponding to the magnitude of the input signal source. Hysteresis is added at the comparator reference input, and also by means of one or more hysteresis transistors whose drains are connected to the common input node. The gates of the hysteresis transistors are controlled so that when the output logic state is low, they are connected to the mirror voltage and a hysteresis current is produced, and when the output logic state is high, no hysteresis current is produced.

68 Claims, 4 Drawing Sheets

FIG. 6 FILTERED APPLICATION WAVEFORMS

EXTERNALLY PROGRAMMABLE, PROCESS AND TEMPERATURE INSENSITIVE THRESHOLD RECEIVER CIRCUIT

BACKGROUND OF THE INVENTION

This invention relates to threshold receiver circuits and, specifically, receiver circuits which are process and temperature insensitive.

Numerous types of receiver circuits are found in the prior art, especially those used to receive signals in computer applications. Typically, the circuits receive an analog input signal which, when the input signal is less than a predetermined minimum threshold, will output a first logic signal and when greater than a predetermined maximum threshold, will output a second logic signal. Receiver circuits are known in the prior art which use an input buffer with hysteresis. However, in the prior art circuits both the positive going and negative going thresholds are strongly dependent upon device process parameters and temperature. Also, in order to achieve apparent thresholds which are outside the range of the supply voltages for the receiver circuit, prior art circuits require at least two resistors per input signal. In addition, testing such prior art circuits is difficult when the logic output signal is not directly observable.

The present invention overcomes these problems in the prior art. An object of the present invention is to improve the signal threshold immunity with respect to process and temperature variations.

The novel circuit of the present invention features thresholds which may be programmed by means of controlling the ratio of a reference resistor to an external resistor for each input signal. Advantages of the receiver circuit of the present invention are that the signal thresholds can be outside of the supply voltage limits for the receiver circuit, and also only one resistor is required per each signal input. The receiver thresholds also have hysteresis. The present invention also makes it possible to test a receiver circuit at its input pin by forcing a voltage and observing a current. This reduces the time and complexity involved with the testing of analog parameters on a complex integrated circuit whose internal nodes cannot be directly measured.

SUMMARY OF THE INVENTION

The threshold receiver is divided into two major portions, the first produces a reference voltage herein referred to as "VMIRR", and the second produces a logic signal which indicates that the received input signal is either above or below pre-programmed threshold levels.

The first portion includes a voltage divider and high-gain amplifier which are used to control the source-to-gate voltage of one or more output transistors in parallel. The resulting total drain currents (herein referred to as "IREF") of these transistors is used to produce a voltage-drop across an external reference resistor ("RREF"). The closed feedback control loop including the amplifier, and output transistors maintain "IREF" close to its nominal value regardless of wide parametric variations of the transistors and wide temperature variations. The gate voltage required to produce "IREF" is the "VMIRR" which is distributed to the second major portion of the receiver circuitry.

The second portion of the receiver has at least one output transistor whose gate(s) is(are) always connected to "VMIRR" and one or more output transistor(s) whose gate(s) is(are) switched to "VMIRR" only when the received signal is above the predetermined threshold.

The geometry of all output transistors is identical and layed-out in such a manner as to enhance matching. Thus, when the drain-to-source voltages of all transistors is approximately equal, the resulting total drain currents in the second major portion of the receiver circuitry, herein referred to as "ISIG", is a multiple or division of "IREF", i.e. proportional to the numbers and sizes of output transistors in the second and first portions of the input circuitry.

"ISIG" is made to flow through another external resistor herein referred to as "RSIG"(REXT), and then through the signal source. Thus, the total voltage-drop across "RSIG" is proportional to the ratio of "RSIG"/"RREF" and the ratio of "ISIG"/"IREF". The non-inverting input of a differential voltage comparator is connected to the drains which source "ISIG" and its inverting input is roughly at the same potential as the drains of the reference transistors.

Thus, the signal source voltage required to bring the non-inverting input to its threshold is equal to the threshold voltage plus or minus the voltage drop across "RREF". The required signal source voltage need not be limited by the power voltages supplied to the circuitry. The required signal source voltage can be programmed by adjusting the values of "RREF", and "RSIG". Also, the change of "ISIG" which occurs as the non-inverting input passes through its threshold results in hysteresis at the signal voltage, and provides a method of observing the output logic state.

The above described assumes that the reference, signal and hysteresis transistors are all P-channel devices, however, the circuit can be implemented with N-channel devices and an appropriate change in the sense of the hysteresis control logic.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
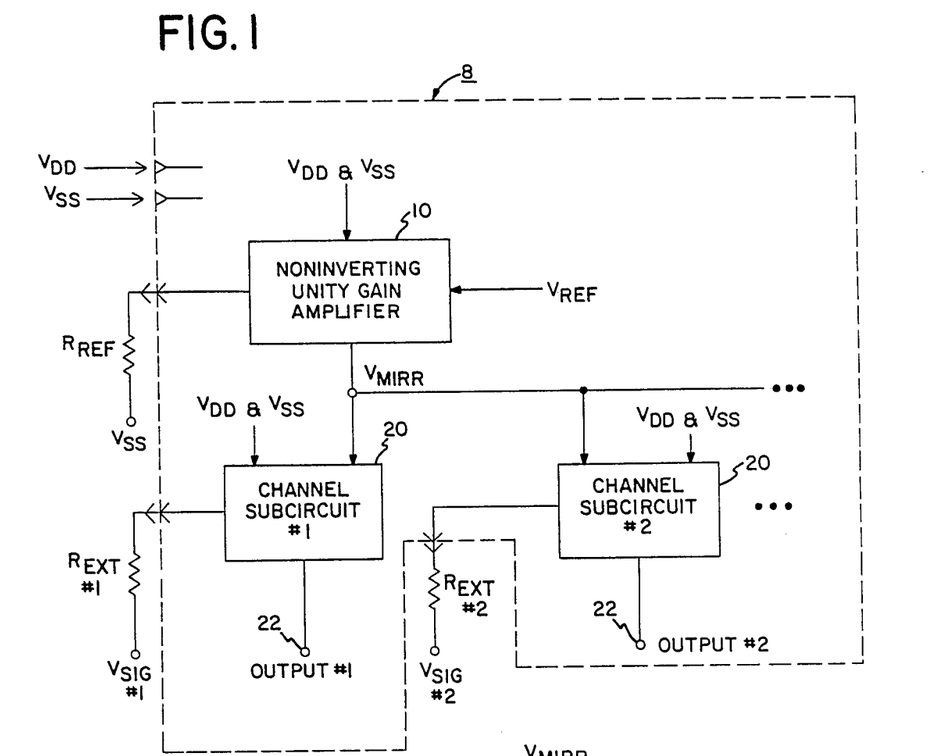
FIG. 1 is a general block diagram of the threshold receiver circuit.

The novel threshold receiver 8 circuit is shown in FIG. 1 in general block diagram form. The receiver circuit has a first portion 10 which is a non-inverting unity gain amplifier which is operatively connected to voltage sources VDD and VSS where VSS may be a common electrical ground. An external resistor RREF is provided and is connected between the output of the non-inverting unity gain amplifier 10 and a second source of voltage which could be VSS. The amplifier 10 also provides a voltage which appears on node VMIRR.

One or more channel subcircuits 20 may be used in the receiver circuit, one subcircuit 20 for each signal, VSIG, which is to be received. Each sub-circuit 20 is powered by the supply voltage VDD and VSS, where VSS may be a common ground point and has associated with it an external resistor REXT which connects to the signal source VSIG. Each of the subcircuits 20 provides a logic output on each terminal 22.

The receiver circuit 8 provides accurate thresholds for input signals, including analog signals and high-speed digital signals. In general terms, a reference current passing through the reference resistor, RREF, is mirrored to the input resistor, REXT thereby causing their respective current flows to be related to each other. The voltage-drop across the input resistor, REXT, is thus proportional to the reference current, to the mirror-transfer coefficient and also to the ratio of the resistors, RREF and REXT, but is insensitive to process and temperature changes. The input signal to the circuit VSIG can be outside the VDD-VSS power-supply range. Input threshold hysteresis for each subcircuit is accomplished by making the mirror-transfer coefficient a function of hysteresis transistors associated with each subcircuit.

Figure 2:
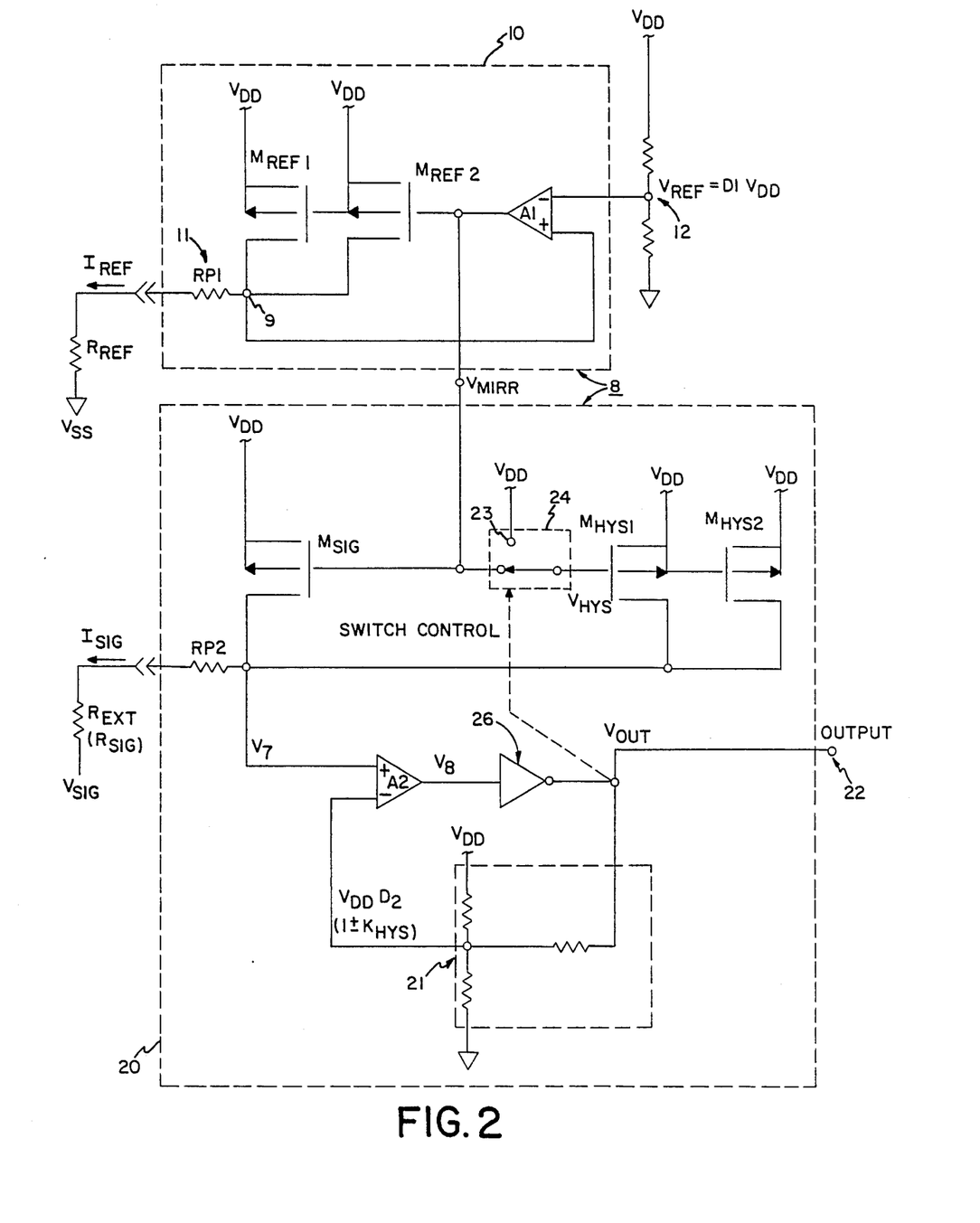
FIG. 2 is a schematic diagram of the FIG. 1 block diagram.

The simplified schematic of FIG. 2 illustrates one embodiment of the present invention. All components, with the exception of resistors RREF and REXT, are fabricated on a common substrate in order to match and track each other closely. A reference circuit is shown which consists of amplifier A1, transistors, MREF1 and MREF2, a reference voltage VREF 12 (shown here as the output of a voltage divider, usually VDD/2, but other reference voltages are also suitable), a protection circuit 11 (such as resistor RP1), and an external reference resistor, RREF. Only one receiver subcircuit 20 is shown, consisting of amplifier A2, switch circuitry 24, three transistors MSIG, MHYS1, and MHYS2, which are matched to the reference transistors, MREF1 and MREF2, a threshold network with voltage hysteresis 21, a logic inverter 26, a protection circuit, (such as resistor RP1), and an external signal resistor, REXT. The completed circuit may contain several channel subcircuits 20, all of which are connected to the single reference circuit 10.

VREF is imposed at the inverting input of amplifier A1. Amplifier A1 and transistors MREF1 and MREF2 together form a non-inverting unity gain amplifier with its output node 9 approximately equal to VREF. The total current through transistors, MREF1 and MREF2, is thus approximately equal to VREF divided by the total resistance (RREF+RP1). The device sizes are such that the gate-source voltage (VDD-VMIRR) is within the range of VDD-VSS.

Each receiver subcircuit 20 contains three transistors, MSIG, MHYS1 and MHYS2, which are matched to the transistors in the reference circuit 10.

Thus, when the switch 24 is in the position shown, and Vos (offset error voltage) and Vgs (gate-source voltage) of MSIG, MHYS1 and MHYS2 are equal to those of MREF1 and MREF2, the mirror transfer coefficient is the ratio of the combined gain of MSIG, MHYS1 and MHYS2 to the combined gains of MREF1 and MREF2. Also, when the switch 24 is in its other state (i.e. connected to terminal 23 shown in FIG. 2), the mirror transfer coefficient is the ratio of the gain of MSIG, to the combined gain of MREF1 and MREF2. The voltage drop across REXT is equal to the product of VREF and the mirror transfer coefficient.

The receiver subcircuit is at its threshold when node V7 is approximately equal to the output of the threshold network 21, $VDD*D2*(1 \pm KHYS)$. Also, VSIG is equal to V7 less the voltage drop across REXT and RP2.

The two possible values of VSIG which bring the receiver sub-circuit to its threshold will be identified as $VTH+$ and $VTH-$, upper and lower thresholds. They can be computed with the following equation:

$$V_{TH+} \text{ or } V_{th-} =$$

$$V_{DD}\left[D_2(1 \pm K_{HYS}) - D_1\frac{(R_{P2} + R_{EXT})}{(R_{P1} + R_{REF})}\left(\frac{W_E}{W_R}\right)\right] +$$

$$V_{OS2} +$$

$$(R_{P2} + R_{EXT})\left(\frac{W_E}{W_R}\right)\left[\pm D_2 V_{DD} K_{HYS} G_{DS1} - \frac{V_{OS1}}{(R_{P1} + R_R)}\right]$$

Where:
VDD=positive power supply
D1=divider 12 ratio in the reference circuit 10
D2=divider 21 ratio in the receiver sub-circuit 20
+KHYS=the factor by which D2 of divider 21 is modified when the circuit is built with voltage hysteresis; positive when Vout 22 is high, negative when Vout 22 is low.
RP1=a circuit protection resistor 11, small when compared with PREF and REXT.
RP2=a circuit protection resistor, to track RP1, and equal to it.
PREF=external reference resistor
REXT=external signal threshold setting resistor.
WR=total effective width of the reference transistors MREF1 & MREF2 in the reference circuit 10
WE=total effective width of the "ON" transistors MSIG or MSIG, MHYS1, MHYS2 in the receiver subcircuit 20 (assuming equal lengths of all transistors in 10 & 20)
GDS=Effective drain-source conductance of the matched transistors MSIG, MHYS1, MHYS2
VOS1=offset error of amplifier A1
VOS2=offset error of amplifier A2

Thus, if it is assumed that the dividers are both equal, with factors D1=D2=0.5, and that RREF=REXT, and (WE/WR)=1.5 (Vout 22 is low), and RP1=RP2, and KHYS=VOS1=VOS2=0 (that is, that voltage hysteresis KHYS is not employed and that voltage offsets for amplifiers A1 and A2 are both equal to zero), $$VTH- = VDD*0.5*(1-1.5) = -VDD/4$$

This is effectively the negative-going threshold voltage of the receiver circuit, and if VSS=0, is outside the range of VDD-VSS.

When the input voltage is more negative than $VTH-$, the internal control circuitry 24 imposes VDD at the gates of MHYS1 and MHYS2, thereby turning these P- channel devices off. The ratio of effective widths (WE/WR) is thereby reduced from 1.5 to 0.5.

Thus, if it is assumed that the dividers are both equal, with factors D1=D2=0.5, and that PREF=REST, and (WE/WR)=0.5, and RP1=RP2, and VOS1-=VOS2=VOS3=0, $$VTH+ = +VDD/4$$

This is effectively the positive-going threshold voltage of the receiver circuit, and if VSS=0, is inside the range of VDD-VSS.

The effective hysteresis at the signal input is the difference between positive-going and negative-going thresholds:

$$[VTH+ - VTH-] \approx VDD*\{2*D2*KHYS + D1*(REXT/RREF)*[(WE/WR)_+ - (WE/WR_-)]\}$$

WHERE:
(WE/WR)$_{30}$ = the ratio of effective widths when Vout 22 is low.
(WE/WR)$_-$ = the ratio of effective widths when Vout 22 is high.

Figure 3:
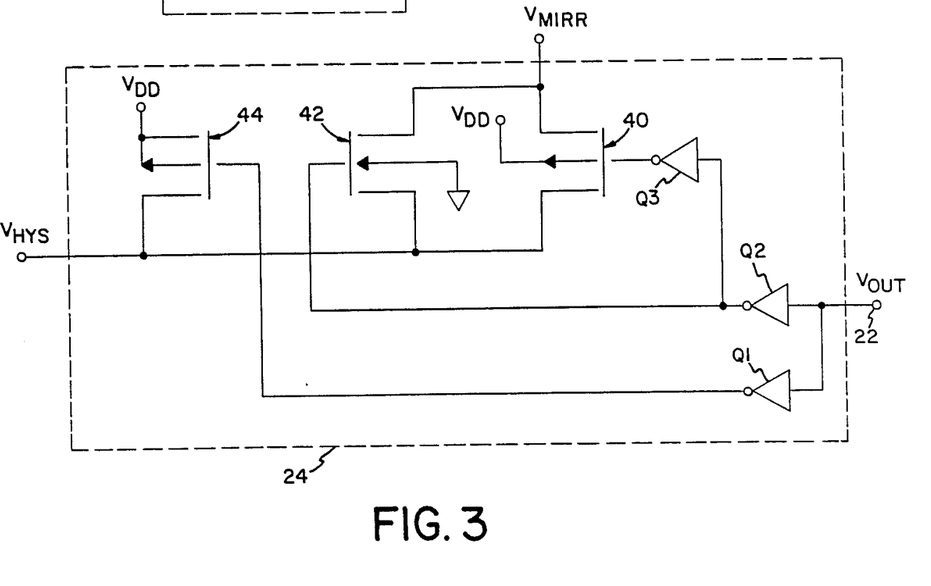
FIG. 3 is a schematic diagram of a portion of the FIG. 2 schematic diagram.

FIG. 3 is a simplified circuit diagram of the switch circuitry 24 depicted in block diagram form in FIG. 2. Inverters Q1 and Q2, have their inputs connected to VOUT 22. A third inverter Q3, has its input connected to the output of second inverter Q2. A first (P-channel) transistor has its gate connected to the output of amplifier, Q3. Its source is connected to $V_{MIRR}$, and its drain is connected to a switching node on which is voltage, VHYS. A second (N-channel) transistor has its gate connected to the output of amplifier Q2. Its drain is connected to VMIRR and its source is connected to the switching node. A third transistor (P-channel) has its gate connected to an output of amplifier Q1, its source to VDD and its drain to the switching node. The switching node is connected to the gates of the hysteresis transistors, MHYS1 and MHYS2.

Figure 4:
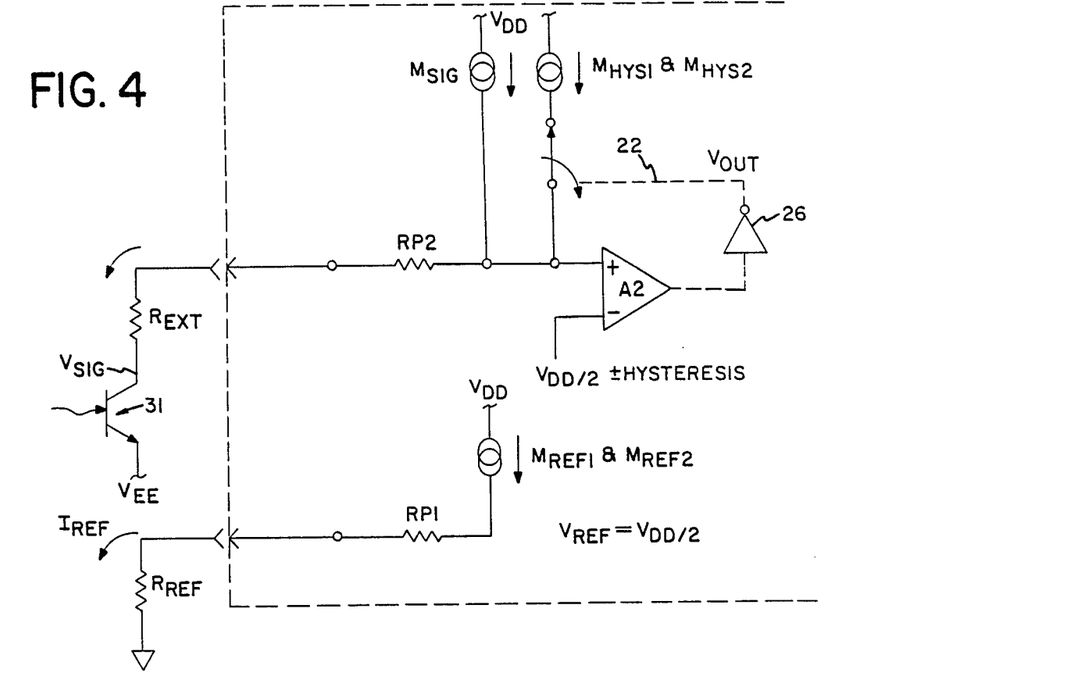
FIG. 4 is a schematic diagram of an unfiltered input application of the FIG. 2 circuit.
Figure 5:
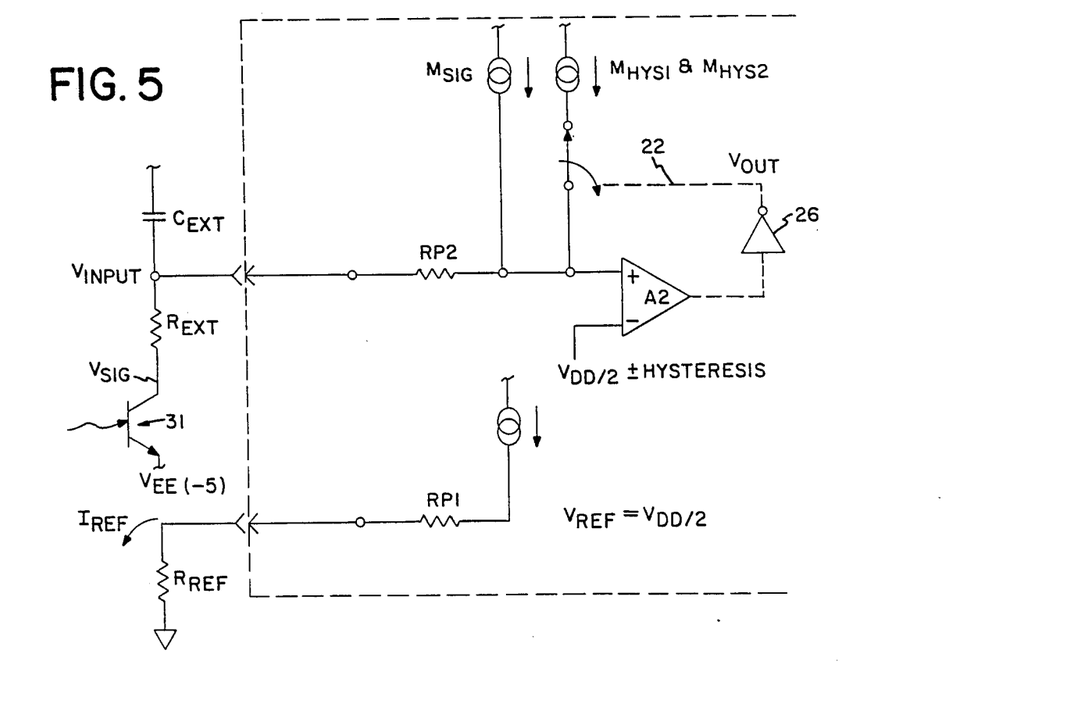
FIG. 5 is a schematic diagram of a filtered input application of the FIG. 2 circuit.

In actual application, signal Inputs may be either unfiltered or filtered as shown in FIGS. 4 and 5.

In one embodiment of the present invention a voltage of approximately VDD/2 is produced across an external reference resistor $R_{REF}$ and between the reference pin and ground, resulting in nominally 112.6 microamps passing through the resistor. This current is mirrored to each of 16 inputs of 16 channel subcircuits. When input voltage VSIG is just above Vth−, 225 microamps is sourced to the external circuitry. When VSIG drops below Vth−, the comparator A2 changes state and also reduces the input current-source to 112.6 microamps. Voltage hysteresis of ±1.0 volt is also added to the inverting input of comparator A2 shown in FIG. 5.

For unfiltered applications, when the input pin is at its threshold, the negative-going signal source $V_{SIG}$ (i.e. the external transistor collector) is at:

$$VSIG=(V_{DD}/2)[1-2*REXT/PREF-KHYS];$$

and a positive-going signal source $V$SIG will be at:

$$VSIG=(V_{DD}/2)[1-REXT/RREF+KHYS].$$

Table 1 lists the effective threshold values of collector voltages for various standard external resistor values when $V_{DD}$=5.0 Ov, KHYS=0.4, and RREF 22K.

TABLE 1

| REXT | Vth− | Vth+ | ($^V$TH+-$^V$TH−) |
|---|---|---|---|
| 5.6K | +0.23 | +2.86 | +2.63 |
| 6.8K | −0.05 | +2.73 | +2.77 |
| 7.5K | −0.2 | +2.65 | +2.85 |
| 8.2K | −0.36 | +2.57 | +2.93 |
| 9.1K | −0.57 | +2.47 | +3.03 |
| 10K | −0.77 | +2.36 | +3.14 |
| 11K | −1.0 | +2.25 | +3.25 |
| 12K | −1.23 | +2.14 | +3.36 |
| 15K | −1.91 | +1.80 | +3.70 |
| 18K | −2.59 | +1.45 | +4.05 |
| 20K | −3.05 | +1.23 | +4.27 |
| 22K | −3.5 | +1.0 | +4.5 |

Figure 6:
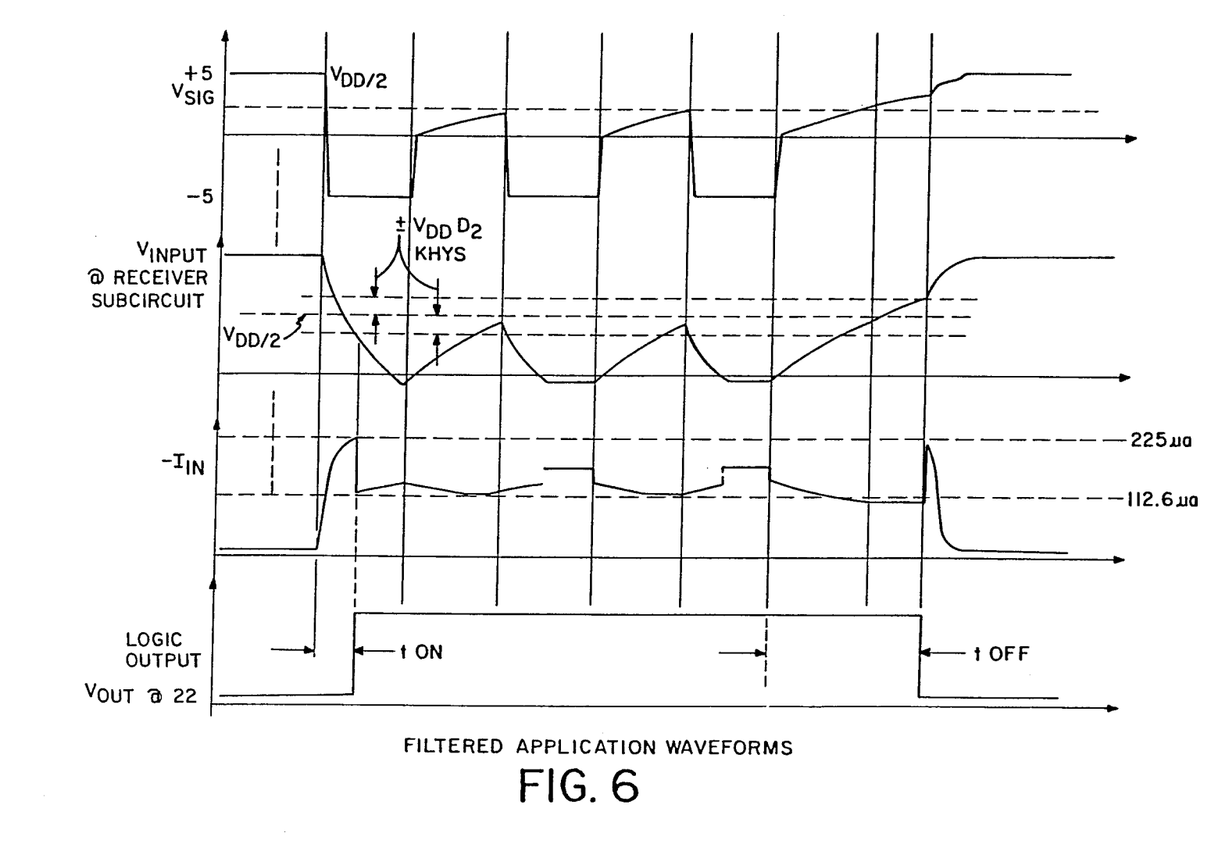
FIG. 6 is a graph of waveforms occurring in the threshold receiver circuit for the filtered application.

Filtering is achieved by adding the capacitor CEXT as shown in FIG. 5. Waveforms for an application are shown in FIG. 6.

Thus when the external photo-transistor 31 is ON, its collector is at −5 v if VEE is slightly less than −5 VDC. During this interval, this phototransistor sinks both capacitor current and input current.

When the capacitor voltage reaches the comparator threshold $V_{DD}$D2(1−KHYS) the input current switches from 225 microamps to 112 microamps, producing a small amount of hysteresis at the non-inverting comparator input, and also increasing the capacitor charging-rate. The threshold network 21 is also switched.

The capacitor continues to charge until it is clamped by internal protection devices at just below VSS.

FIG. 6 illustrates the waveforms corresponding to the filtered input application shown in FIG. 5, combined with the circuit shown in FIG. 2. It is there seen that the voltage to phototransistor 31 (see FIG. 5) causes a change in the input voltage at the junction of CEXT and REXT which is modified by the charging rate of capacitor CEXT as governed by resistor REXT. It is also seen that the current through RP2 (−IIn) does not change state until VINPUT (see FIG. 5) is less than $V_{DD}$D2 plus or minus ($V_{DD}$D2) KHYS. This in turn causes the output voltage (VOUT 22) to change state.

The invention is not limited to the particular details of the apparatus and method depicted and other modifications and applications are contemplated. Certain other changes may be made in the above described apparatus and method without departing from the true spirit and scope of the invention herein involved. It is intended, therefore, that the subject matter in the above depiction shall be interpreted as illustrative and not in a limiting sense.

What is claimed is:

1. A receiver circuit for converting at least one input signal into a corresponding digital output signal such that each digital output signal is of a first value if the corresponding input signal is less than a corresponding first threshold voltage value and each digital output signal is of a second value if the corresponding input signal is greater than a second threshold voltage value, the output signal first value or second value being maintained when the input signal is equal to or between the first and second threshold values, comprising:

(A) an amplifier comprising:
(1) a reference resistor through which a reference current passes, the reference current being substantially independent of temperature and process variations; and (2) means for providing the reference current, said means including at least one reference transistor and a differential amplifier, the differential amplifier having a first input connected to a reference voltage and a second input having a voltage value related to the voltage drop across the reference resistor, the output of the differential amplifier controlling the reference transistor(s) and representing a mirror voltage (VMIRR) whose value is related to the reference current; and (B) a receiver for each input signal, each receiver comprising:

(1) an external resistor connected at one end to one input signal;

(2) means, each connected to the other end of the corresponding external resistor, for generating a mirror current therethrough, said mirror current having a first low value or a second higher value and changing state to the first low value if the input signal value is less than the first threshold value and changing state to the second higher value if the input signal is greater than the second threshold value, said means having at least one signal transistor matched to each reference transistor, with the gate of each signal transistor connected to the mirror voltage output and the drain of each signal transistor connected to a common node which in turn is electrically connected to the other end of the external resistor, thereby generating the first mirror current value into said node, and none or at least one hysteresis transistor, each hysteresis transistor matched to each reference transistor and each signal transistor, with the drain of each hysteresis transistor connected to said common node and the gate of each hysteresis transistor connected to the mirror voltage output when said means is in a second state, thereby generating an additional current which is added to the first mirror current value to yield the second mirror current value, and the gate of each hysteresis transistor effectively connected to the potential of its respective source when said means is in the first state so as to generate no additional current when in said state, said first and second mirror current values being proportional to the reference current based upon the combined transistor gain for all the reference transistor(s) to the combined transistor gain for all the signal transistor(s) (for the first threshold) and the combined transistor gain for all the reference transistor(s) and all the hysteresis transistor(s) to the combined transistor gain for all the signal transistors (for the second threshold value), said first and second mirror current values thereby establishing the first and second threshold voltage values in association with the external resistor;

(3) means connected to the mirror current generating means, for generating the digital output signal such that said output signal changes state to said first value if the input signal is less than the first threshold voltage value and changes state to said second value if the input signal is greater than the second threshold value; and (4) means connected to the mirror voltage, the source(s) of each hysteresis transistors, the digital output signal, and the gate of each hysteresis transistors, for controlling the gate of each hysteresis transistor so as to connect the gate of each hysteresis transistor to the mirror voltage if the digital output signal is said second value and to connect the gate of each hysteresis transistor to its respective source if the digital output signal is said first value;

whereby the signal threshold for each receiver is dependent upon the ratio of the reference resistor to the corresponding external resistor, the reference voltage, as well as ratios of the combined transistor gain for all the reference transistor(s) to the combined transistor gain for all the signal transistor(s) (for the first threshold) and the combined transistor gain for all the reference transistor(s) and all the hysteresis transistor(s) to the combined transistor gain for all the signal transistor(s) (for the second threshold) for the corresponding receiver, and is independent of process and temperature variations due to the matching of the reference, signal and hysteresis transistors.

2. A receiver circuit as defined in claim 1, wherein the reference, signal and hysteresis transistors are all fabricated on the same substrate.

3. A receiver circuit as defined in claim 2, where the number of reference transistors is two, the number of signal transistors is one, and the number of hysteresis transistors is two.

4. A receiver circuit as defined in claim 3, wherein the amplifier and each receiver are all fabricated as part of an integrated circuit except for the reference resistor and each external resistor.

5. A receiver circuit as defined in claim 4, further comprising means for producing a voltage hysteresis for augmenting the voltage difference between the first and second threshold values.

6. A receiver circuit as defined in claim 5, wherein the digital output signal generating means comprises an inverting amplifier and the voltage hysteresis means comprises a voltage divider and a first resistor connected at one end to the middle node of the voltage divider and to the output of the digital output signal means at its other end, a differential amplifier connected to the voltage divider middle node at one input thereof, the second input to the differential amplifier connected to the common node of the signal and hysteresis transistors, the output of the differential amplifier connected to the input of the digital output signal generating means inverting amplifier.

7. A receiver circuit as defined in claim 6, wherein the voltage of said middle node is substantially equal to the reference voltage of the means for providing the reference current.

8. A receiver circuit as defined in claim 6, wherein each receiver further comprises a phototransistor for receipt of the corresponding input signal, said phototransistor connected to the external resistor.

9. A receiver circuit as defined in claim 8, wherein each receiver further incorporates a capacitor connected to the external resistor at its end opposite the connection to the phototransistor for filtering the corresponding input signal.

10. A receiver circuit as defined in claim 5, wherein each receiver further comprises a phototransistor for receipt of the corresponding input signal, said phototransistor connected to the external resistor.

11. A receiver circuit as defined in claim 10, wherein each receiver further incorporates a capacitor connected to the external resistor at its end opposite the connection to the phototransistor for filtering the corresponding input signal.

12. A receiver circuit as defined in claim 3, wherein each receiver further comprises a phototransistor for receipt of the corresponding input signal, said phototransistor connected to the external resistor.

13. A receiver circuit as defined in claim 12, wherein each receiver further incorporates a capacitor connected to the external resistor at its end opposite the connection to the phototransistor for filtering the corresponding input signal.

14. A receiver circuit as defined in claim 1, wherein each receiver further comprises a phototransistor for receipt of the corresponding input signal, said phototransistor connected to the external resistor.

15. A receiver circuit as defined in claim 14, wherein each receiver further incorporates a capacitor connected to the external resistor at its end opposite the connection to the phototransistor for filtering the corresponding input signal.

16. A receiver circuit as defined in claim 1, wherein the amplifier and each receiver are fabricated on an integrated circuit except for the reference resistor and each external resistor.

17. A receiver circuit as defined in claim 16, wherein the reference, signal and hysteresis transistors are all fabricated on the same substrate.

18. A receiver circuit as defined in claim 17, further comprising means for producing a voltage hysteresis for augmenting the voltage difference between the first and second threshold values.

19. A receiver circuit as defined in claim 1, wherein the means for controlling the gate of each hysteresis transistor comprises:
  (a) first and second inverting amplifiers (Q1 and Q2) having their inputs connected to the digital output signal (VOUT 22);
  (b) a third inverting amplifier (Q3) having its input connected to the output of the second amplifier;
  (c) a first transistor (40) having its gate connected to the output of the third amplifier and having its source connected to the mirror voltage (VMIRR), and having its drain connected to the gate of each hysteresis transistor (VHYS);
  (d) a second transistor (42) having its gate connected to the output of the second amplifier, having its drain connected to the mirror voltage and having its source connected to the gate of each hysteresis transistor; and
  (e) a third transistor (44) having its gate connected to the output of the first amplifier, and having its source connected to a voltage source (VDD) and a drain connected to the gate of each hysteresis transistor.

20. A receiver circuit as defined in claim 1, wherein the reference voltage is generated by a voltage divider comprising first and second resistors connected in series to each other with a voltage source providing a voltage potential across the first and second resistors.

21. A receiver circuit as defined in claim 1, wherein the means for generating the digital output signal comprises an inverting amplifier, a differential amplifier having a first input connected to the common node of the signal and hysteresis transistors, and a second input connected to a second reference voltage, the output of the differential amplifier connected to the input of the inverting amplifier, and the output of the inverting amplifier being the digital output signal.

22. A receiver circuit as defined in claim 21, wherein the second reference voltage is substantially the same as the reference voltage of the means for providing the reference current.

23. A receiver circuit as defined in claim 21, further comprising means for producing a voltage hysteresis for augmenting the voltage difference between the first and second threshold values.

24. A receiver circuit as defined in claim 22, wherein the voltage hysteresis means comprises a voltage divider and a first resistor connected at one end to the middle node of the voltage divider and to the output of the digital output signal means at its other end, with the second reference voltage generated at the middle node of the voltage divider which is connected to the second input of said differential amplifier.

25. A receiver circuit as defined in claim 21, wherein each receiver further comprises a phototransistor for receipt of the corresponding input signal, said phototransistor connected to the external resistor.

26. A receiver circuit as defined in claim 25, wherein each receiver further incorporates a capacitor connected to the external resistor at its end opposite the connection to the phototransistor for filtering the corresponding input signal.

27. A receiver circuit as defined in claim 21, wherein the means for controlling the gate of each hysteresis transistor comprising:
  (a) first and second inverting amplifiers (Q1 and Q2) having their inputs connected to the digital output signal (VOUT 22);
  (b) a third inverting amplifier (Q3) having its input connected to the output of the second amplifier;
  (c) a first transistor (40) having its gate connected to the output of the third amplifier and having its source connected to the mirror voltage (VMIRR), and having its drain connected to the gate of each hysteresis transistor (VHYS),
  (d) a second transistor (42) having its gate connected to the output of the second amplifier, having its drain connected to the mirror voltage and having its source connected to the gate of each hysteresis transistor,
  (e) a third transistor (44) having its gate connected to the output of the first amplifier, and having its source connected to a voltage source (VDD) and a drain connected to the gate of each hysteresis transistor.

28. A receiver circuit as defined in claim 21, further comprising a first protection circuit between the reference resistor and the means for providing the reference current, and for each receiver a second protection circuit between the external resistor and the means for generating the mirror current.

29. A receiver circuit as defined in claim 28, wherein the first and second protection circuits each comprise a resistor.

30. A receiver circuit as defined in claim 1, wherein the means for controlling the gate of each hysteresis transistor comprises:
  (a) first and second amplifiers (Q1 and Q2) having their inputs connected to the digital output signal (VOUT 22);
  (b) a third amplifier (Q3) having its input connected to the output of the second amplifier;

(c) a first transistor (40) having its gate operatively connected to the output of the third amplifier and having its source operatively connected to the mirror voltage (VMIRR), and having its drain operatively connected to the gate of each hysteresis transistor (VHYS);

(d) a second transistor (42) having its gate operatively connected to the output of the second amplifier, having its source operatively connected to the mirror voltage and having its drain operatively connected to the gate of each hysteresis transistor;

(e) a third transistor (44) having its gate operatively connected to the output of the first amplifier, and having it source operatively connected to a voltage source (VDD) and a drain operatively connected to the gate of each hysteresis transistor.

31. A receiver circuit as defined in claim 30, wherein the reference, signal and hysteresis transistors are all fabricated on the same substrate.

32. A receiver circuit as defined in claim 31, where the number of reference transistors is two, the number of signal transistors is one, and the number of hysteresis transistors is two.

33. A receiver circuit as defined in claim 32, further comprising means for producing a voltage hysteresis for augmenting the voltage difference between the first and second threshold values.

34. A receiver circuit as defined in claim 33, wherein the digital output signal generating means comprises an inverting amplifier and the voltage hysteresis means comprises a voltage divider and first resistor connected at one end of the middle node of the voltage divider and to the output of the digital output signal means at its other end, a differential amplifier connected to the voltage divider middle node at one input thereof, the second input to the differential amplifier connected to the common node of the signal and hysteresis transistors, the output of the differential amplifier connected to the input of the digital output signal generating means inverting amplifier.

35. A receiver circuit as defined in claim 34, wherein the voltage of said middle node is substantially equal to the reference voltage of the means for providing the reference current.

36. A receiver circuit as defined in claim 35, wherein each receiver further comprises a phototransistor for receipt of the corresponding input signal, said phototransistor connected to the external resistor.

37. A receiver circuit as defined in claim 36, wherein each receiver further incorporates a capacitor connected to the external resistor at its end opposite the connection to the phototransistor for filtering the corresponding input signal.

38. A receiver circuit as defined in claim 1, further comprising a first protection circuit between the reference resistor and the means for providing the reference current, and for each receiver a second protection circuit between the external resistor and the means for generating the mirror current.

39. A receiver circuit as defined in claim 38, wherein the first and second protection circuits each comprise a resistor.

40. A receiver circuit for converting at least one input signal into a corresponding digital output signal such that each digital output signal is of a first value if the corresponding input signal is less than a corresponding first threshold voltage value and each digital output signal is of a second value if the corresponding input signal is greater than a second threshold voltage value, the output signal first value or second value being maintained when the input signal is equal to or between the first and second threshold values, comprising:

A. an amplifier comprising:
(1) a reference resistor through which a reference current passes, the reference current being substantially independent of temperature and process variations; and
(2) means for providing the reference current, said means including at least one reference transistor and a differential amplifier, the differential amplifier having a first input connected to a reference voltage and a second input having a voltage value related to the voltage drop across the reference resistor, the output of the differential amplifier controlling the reference transistor(s) and representing a mirror voltage (VMIRR) whose value is related to the reference current; and B. a receiver for each input signal, each receiver comprising:
(1) an external resistor connected at one end to one input signal;
(2) means, each connected to the other end of the corresponding external resistor, for generating a mirror current therethrough, said mirror current having a first value or a second different value and changing state to the first value if the input signal value is less than the first threshold value and changing state to the second value if the input signal is greater than the second threshold value, said means having at least one signal transistor matched to each reference transistor, with the gate of each signal transistor connected to the mirror voltage output and the drain of each signal transistor connected to a common node which in turn is electrically connected to the other end of the external resistor, thereby generating the first mirror current value into said node, and at least one hysteresis transistor, each hysteresis transistor matched to each reference transistor and each signal transistor, with the drain of each hysteresis transistor connected to said common node and the gate of each hysteresis transistor connected to the mirror voltage output when said means is in a second state, thereby generating an additional current which is added to the first mirror current value to yield the second mirror current value, and the gate of each hysteresis transistor connected to a higher voltage source when said means is in the first state so as to generate no additional current when in said state, said first and second mirror current values being proportional to the reference current based upon the combined transistor gain for all the reference transistors(s) to the combined transistor gain for all the signal transistor(s) (for the first threshold) and the combined transistor gain for all the reference transistors(s) and all the hysteresis transistor(s) to the combined transistor gain for all the signal transistors (for the second threshold value), said first and second mirror current values thereby establishing the first and second threshold voltage values in association with the external resistor;
(3) means interfaced with to the mirror current generating means, for generating the digital output signal such that said output signal changes state to said first value if the input signal is less than the first threshold voltage value and changes state to said second value if the input signal is greater than the second threshold value; and (4) means interfaced with the digital output signal, for controlling each hysteresis transistor so as to connect the gate of each hysteresis transistor to the mirror voltage if the digital output signal is said first value and to connect the gate of each hysteresis transistor to the higher potential if the digital output signal is said second value;

whereby the signal threshold for each receiver is dependent upon the ratio of the reference resistor to the corresponding external resistor, the reference voltage, as well as ratios of the combined transistor gain for all the reference transistor(s) to the combined transistor gain for all the signal transistor(s) (for the first threshold) and the combined transistor gain for all the reference transistor(s) and all the hysteresis transistor(s) to the combined transistor gain for all the signal transistor(s) (for the second threshold) for the corresponding receiver, and is independent of process and temperature variations due to the matching of the reference, signal and hysteresis transistors.

41. A receiver circuit as defined in claim 40, wherein the reference, signal and hysteresis transistors are all fabricated on the same substrate.

42. A receiver circuit as defined in claim 41, where the number of reference transistors is two, the number of signal transistors is one, and the number of hysteresis transistors is two.

43. A receiver circuit as defined in claim 42, further comprising means for producing a voltage hysteresis for augmenting the voltage difference between the first and second threshold values.

44. A receiver circuit as defined in claim 43, wherein the digital output signal generating means comprises an inverting amplifier and the voltage hysteresis means comprises a voltage divider and first resistor connected at one end to the middle node of the voltage divider and to the output of the digital output signal means at its other end, a differential amplifier connected to the voltage divider middle node at one input thereof, the second input to the differential amplifier connected to the common node of the signal and hysteresis transistors, the output of the differential amplifier connected to the input of the digital output signal generating means inverting amplifier.

45. A receiver circuit as defined in claim 44, wherein the voltage of said middle node is substantially equal to the reference voltage of the means for providing the reference current.

46. A receiver circuit as defined in claim 45, wherein each receiver further comprises a phototransistor for receipt of the corresponding input signal, said phototransistor connected to the external resistor.

47. A receiver circuit as defined in claim 46, wherein each receiver further incorporates a capacitor connected to the external resistor at its end opposite the connection to the phototransistor for filtering the corresponding input signal.

48. A receiver circuit as defined in claim 43, wherein each receiver further comprises a phototransistor for receipt of the corresponding input signal, said phototransistor connected to the external resistor.

49. A receiver circuit as defined in claim 42, wherein each receiver further incorporates a capacitor connected to the external resistor at its end opposite the connection to the phototransistor for filtering the corresponding input signal.

50. A receiver circuit as defined in claim 40, wherein each receiver further comprises a phototransistor for receipt of the corresponding input signal, said phototransistor connected to the external resistor.

51. A receiver circuit as defined in claim 50, wherein each receiver further incorporates a capacitor connected to the external resistor at its end opposite the connection to the phototransistor for filtering the corresponding input signal.

52. A receiver circuit as defined in claim 51, wherein the means for controlling the gate of each hysteresis transistor comprises:

(a) first and second inverting amplifiers (Q1 and Q2) having their inputs connected to the digital output signal (VOUT 22);

(b) a third inverting amplifier (Q3) having its input connected to the output of the second amplifier;

(c) a first transistor (40) having its gate connected to the output of the third amplifier and having its source connected to the mirror voltage (VMIRR), and having its drain connected to the gate of each hysteresis transistor (VHYS);

(d) a second transistor (42) having its gate connected to the output of the second amplifier, having its drain connected to the mirror voltage and having its source connected to the gate of each hysteresis transistor; and (e) a third transistor (44) having its gate connected to the output of the first amplifier, and having its source connected to a voltage source (VDD) and a drain connected to the gate of each hysteresis transistor.

53. A receiver circuit as defined in claim 52, further comprising a first protection circuit between the reference resistor and the means for providing the reference current, and for each receiver a second protection circuit between the external resistor and the means for generating the mirror current.

54. A receiver circuit as defined in claim 53, wherein the first and second protection circuits each comprise a resistor.

55. A receiver circuit as defined in claim 40, wherein the amplifier and each receiver are fabricated on an integrated circuit except for the reference resistor and each external resistor.

56. A receiver circuit as defined in claim 55, wherein the reference, signal and hysteresis transistors are all fabricated on the same substrate.

57. A receiver circuit as defined in claim 56, further comprising means for producing a voltage hysteresis for augmenting the voltage difference between the first and second threshold values.

58. A receiver circuit as defined in claim 40, wherein the reference voltage is generated by a voltage divider comprising first and second resistors connected in series to each other with a voltage source providing a voltage potential across the first and second resistors.

59. A receiver circuit as defined in claim 40, wherein the means for controlling the gate of each hysteresis transistor comprises:

(a) first and second inverting amplifiers (Q1 and Q2) having their inputs connected to the digital output signal (VOUT 22);

(b) a third inverting amplifier (Q3) having its input connected to the output of the second amplifier;

(c) a first transistor (40) having its gate connected to the output of the third amplifier and having its source connected to the mirror voltage (VMIRR), and having its drain connected to the gate of each hysteresis transistor (VHYS), (d) a second transistor (42) having its gate connected to the output of the second amplifier, having its drain connected to the mirror voltage and having its source connected to the gate of each hysteresis transistor, (e) a third transistor (44) having its gate connected to the output of the first amplifier, and having its source connected to a voltage source (VDD) and a drain connected to the gate of each hysteresis transistor.

60. A receiver circuit as defined in claim 40, further comprising a first protection circuit between the reference resistor and the means for providing the reference current, and for each receiver a second protection circuit between the external resistor and the means for generating the mirror current.

61. A receiver circuit as defined in claim 60, wherein the first and second protection circuits each comprise a resistor.

62. A receiver circuit as defined in claim 40, wherein the means for generating the digital output signal comprises an inverting amplifier, a differential amplifier having a first input connected to the common node of the signal and hysteresis transistors, and a second input connected to a second reference voltage, the output of the differential amplifier connected to the input of the inverting amplifier, and the output of the inverting amplifier being the digital output signal.

63. A receiver circuit as defined in claim 62, wherein the second reference voltage is substantially the same as the reference voltage of the means for providing the reference current.

64. A receiver circuit as defined in claim 40, further comprising means for producing a voltage hysteresis for augmenting the voltage difference between the first and second threshold values.

65. A receiver circuit as defined in claim 64, wherein the voltage hysteresis means comprises a voltage divider and a first resistor connected at one end to the middle node of the voltage divider and to the output of the digital output signal means at its other end, with the second reference voltage generated at the middle node of the voltage divider which is connected to the second input of said differential amplifier.

66. A receiver circuit as defined in claim 62, wherein each receiver further comprises a phototransistor for receipt of the corresponding input signal, said phototransistor connected to the external resistor.

67. A receiver circuit as defined in claim 66, wherein each receiver further incorporates a capacitor connected to the external resistor at its end opposite the connection to the phototransistor for filtering the corresponding input signal.

68. A receiver circuit as defined in claim 62, wherein the means for controlling the gate of each hysteresis transistor comprises:

(a) first and second inverting amplifiers (Q1 and Q2) having their inputs connected to the digital output signal (VOUT 22);

(b) a third inverting amplifier (Q3) having its input connected to the output of the second amplifier;

(c) a first transistor (40) having its gate connected to the output of the third amplifier and having its source connected to the mirror voltage (VMIRR), and having its drain connected to the gate of each hysteresis transistor (VHYS), (d) a second transistor (42) having its gate connected to the output of the second amplifier, having its drain connected to the mirror voltage and having its source connected to the gate of each hysteresis transistors, (e) a third transistor (44) having its gate connected to the output of the first amplifier, and having its source connected to a voltage source (VDD) and a drain connected to the gate of each hysteresis transistor.

* * * * *